US012406116B2

(12) United States Patent
Lin et al.

(10) Patent No.: US 12,406,116 B2
(45) Date of Patent: Sep. 2, 2025

(54) COMPUTER READABLE RECORDING MEDIUM WITH STORED PROGRAM AND METHOD OF EXTRACTING PARASITIC PARAMETERS OF A 3D IC THEREOF

(71) Applicant: UNITED MICROELECTRONICS CORP., Hsin-Chu (TW)

(72) Inventors: Chih-Yueh Lin, Hsinchu County (TW); Chun-Yi Lin, Hsinchu County (TW); Shang-Yu Liu, Hsinchu County (TW); Jie-Ru Bai, Taichung (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 847 days.

(21) Appl. No.: 17/691,127

(22) Filed: Mar. 10, 2022

(65) Prior Publication Data
US 2023/0237228 A1 Jul. 27, 2023

(30) Foreign Application Priority Data
Jan. 26, 2022 (CN) .......................... 202210092614.1

(51) Int. Cl.
*G06F 30/327* (2020.01)
*G06F 30/392* (2020.01)

(52) U.S. Cl.
CPC .......... *G06F 30/327* (2020.01); *G06F 30/392* (2020.01)

(58) Field of Classification Search
USPC ........................................................ 716/104
See application file for complete search history.

(56) References Cited

U.S. PATENT DOCUMENTS

| 9,223,912 | B1 | 12/2015 | Liapis | |
|---|---|---|---|---|
| 9,582,630 | B2 | 2/2017 | Wu | |
| 2014/0310675 | A1 | 10/2014 | Liu | |
| 2020/0074036 | A1* | 3/2020 | Shurygin | G06F 30/398 |
| 2023/0237228 | A1* | 7/2023 | Lin | G06F 30/398 |
| | | | | 716/104 |

FOREIGN PATENT DOCUMENTS

| CN | 116542205 A | * | 8/2023 | ........... G06F 30/327 |
|---|---|---|---|---|
| JP | 2019164756 A | * | 9/2019 | ......... G06F 17/5018 |

* cited by examiner

*Primary Examiner* — Mohammed Alam
(74) *Attorney, Agent, or Firm* — Winston Hsu

(57) ABSTRACT

A method of extracting parasitic parameters of a 3D IC is provided in the present invention, including steps of providing a 3D IC having multiple dies, merging respective layouts of the multiple dies into a common layout, creating a common LVS file and a common LPE file for those multiple dies based on the common layout, creating respective LVS files and respective LPE files for every die based on the respective layouts, creating a common netlist from the common LVS file and common LPE file, creating corresponding respective netlists from the respective LVS files and respective LPE files, merging the common netlist and respective netlists into a netlist, and extracting common parasitic parameters of the dies from the netlist.

12 Claims, 4 Drawing Sheets

COMPUTER READABLE RECORDING MEDIUM WITH STORED PROGRAM AND METHOD OF EXTRACTING PARASITIC PARAMETERS OF A 3D IC THEREOF

BACKGROUND OF THE INVENTION

1. Field of the Invention

The present invention relates generally to a method of extracting parasitic parameters of a 3D IC in a design database, and more specifically, to a method of extracting parasitic parameters of a 3D IC in a design database and computer readable recording medium with stored program thereof.

2. Description of the Prior Art

Design rule checking (DRC), layout versus schematic (LVS) and layout parasitic extraction (LPE) are important components of electronic design automation (EDA). DRC determines if a physical layout of designated IC chip meets the requirement of design parameter and design rule. DRC check is performed to a drawn and edited layout according to the process of foundry. LVS is performed to evaluate if a layout is identical to a schematic. LPE is performed to extract parasitic parameters (ex. RC) from a layout to create a netlist, which describes the connectivity, resistance, capacitance or other electrical properties or dimension of components in the layout.

In response to the physical limit of electronics and material encountered in semiconductor process, 3D IC technology emerges in the field with the approach of using through silicon via (TSV) or hybrid bonding to integrate multiple dies vertically in a 3D space, achieving the interconnection between dies in vertical direction, thereby significantly increasing layout density. Nevertheless, current EDA tool may only extract parasitic parameters of respective dies in a design database of 3D IC rather than completely extract the parasitic parameters of entire 3D IC, especially the parasitic parameters at hybrid bonding interfaces between dies. Therefore, those of skilled in the art still need to improve current methods of extracting parasitic parameters, in hope of fully applying them in 3D IC design.

SUMMARY OF THE INVENTION

In the light of aforementioned current situation of the prior art, the present invention hereby provides a novel method of extracting parasitic parameters of a 3D IC in a design database, which can extract complete parasitic parameters (including the ones at hybrid bonding interfaces between dies) of a 3D IC.

One aspect of the present invention is to provide a method of extracting parasitic parameters of a 3D IC, including steps of providing a design database of a 3D IC having multiple dies stacked and connected together through hybrid bonding vias, merging respective layouts of the multiple dies into a common layout, creating a common layout versus schematic (LVS) file and a common layout parameter extraction (LPE) file for the multiple dies based on the common layout, creating respective LVS files and respective LPE files for every die based on the respective layouts, creating a common netlist based on the common LVS file and the common LPE file, creating corresponding respective netlists based on the respective LVS files and the respective LPE files, merging the common netlist and the respective netlists into a netlist, and extracting common parasitic parameters of the multiple dies from the netlist.

Another aspect of the present invention is to provide a computer readable recording medium with stored program, wherein following steps are performed when a computer executes said program: providing a design database of 3D IC with multiple dies stacked and connected together through hybrid bonding vias, merging respective layouts of the multiple dies in the design database into a common layout, creating a common layout versus schematic (LVS) file and a common layout parameter extraction (LPE) file for the multiple dies based on the common layout, creating respective LVS files and respective LPE files for every die based on the respective layouts, creating a common netlist based on the common LVS file and the common LPE file, creating corresponding respective netlists based on the respective LVS files and the respective LPE files, merging the common netlist and the respective netlists into a netlist, and extracting common parasitic parameters of the multiple dies from the netlist.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
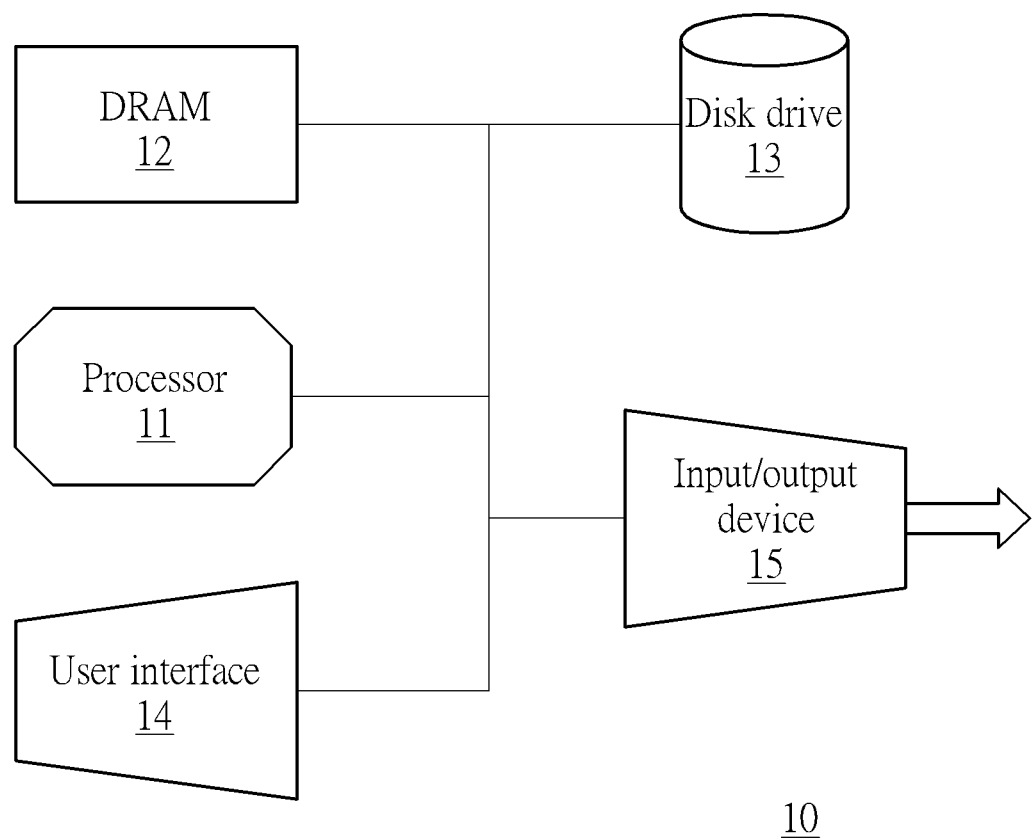
FIG. 1 is a block diagram of the components in a general-purpose computer architecture for executing the method of extracting parasitic parameters in the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

One or more embodiments of the present invention pertain to methods for checking integrated circuit (IC) designs and simulating electrical parameters therein, including steps like layout versus schematic (LVS) and layout parameter extraction (LPE). Preferably, one or more of such embodiments are embodied in a computer implemented LVS and LPE circuit simulation program. In the following description, numerous specific details are set forth in order to provide a thorough understanding of the present invention. It will be understood, however, by one or ordinary skill in the art, that some embodiments of the present invention may be practiced without some or all of these specific details. In other instances, well known process operations will not be described in detail in order not to obscure an understanding of the present invention.

FIG. 1 illustrates a general purpose computer architecture 10 which is able to execute the method of extracting parasitic parameter according to the present invention. A user may enter commands through a user interface 14 consisting of devices like display, keyboard and mouse. A processor 11 reads, compute and process the computer readable code and data from dynamic random access memory (DRAM) 12. A high capacity secondary storage device, such as a disk drive 13, provides program code and data which can be loaded into the DRAM 12. An input/output device 15 provides connectivity to various other elements, such as networks, modems, or printers.

The computer-implemented method of extracting parasitic parameters in the present invention is generally implemented through an electronic design automation (EDA) platform installed on the aforementioned computer architecture 10. For example, the EDA platform may include StarRC™ of SYNOPSYS® company, Quantus™ of CADENCE® company or Calibre™ of MENTOR® company. Regarding the present invention, please note that in the flow of circuit design, all circuit simulation tools, layout tools or examination tools that use device models as input basis (for example, the circuit design program capable of using files or formats like layout, circuit schematic or netlist to perform calculation, modification or process) can apply the method of extracting parasitic parameters provided by the present invention. The tool is not limited in the aforementioned commercial software.

Package design kit (PDK) provided by foundry is usually used first in common circuit design flow to design circuit in order to quickly find out suitable circuit architectures and simulate relevant specification or rule in order to meet corresponding requirement. After the circuit design stage is completed, the flow will enter circuit layout stage, which layout vs. schematic (LVS) and design rule checking (DRC) will be performed in this stage to embody the designed circuit. After the circuit layout stage is completed, a step of layout parasitic extraction (LPE) will be performed to ensure the influence of layout on the circuit properties. If the simulation result can't conform to the specification, the circuit will be reinforced or layout parasitic properties will be analyzed to revise the circuit or layout pattern in order to meet the specification.

Figure 2:
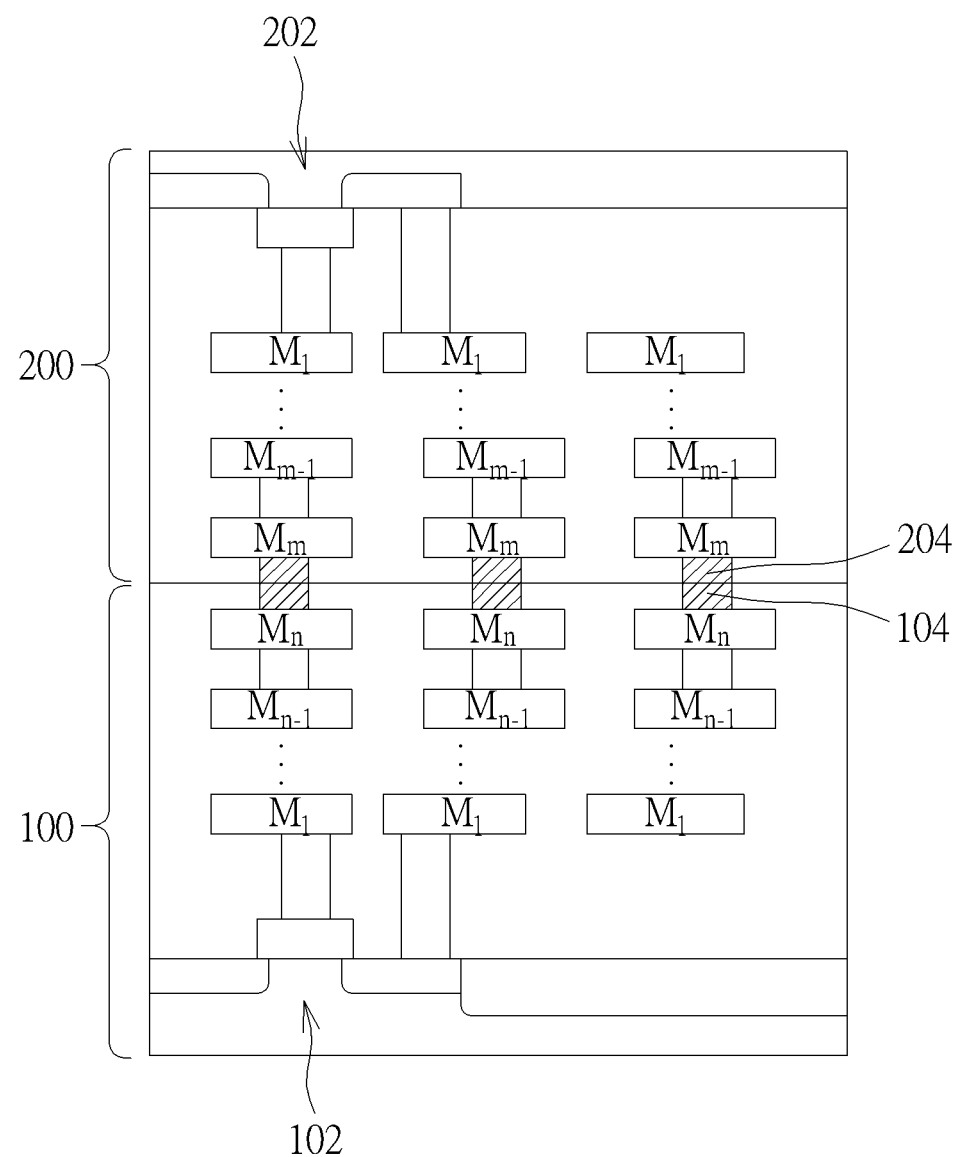
FIG. 2 is a schematic cross-section of a 3D IC in an environment of layout parameter extraction (LPE) tool interface in prior art.

Please refer to FIG. 2, which is a schematic cross-section of a 3D IC in a design database in an environment of layout parameter extraction (LPE) tool interface in prior art. As shown in FIG. 2, a 3D IC consists of at least two dies 100, 200, wherein each die 100, 200 is provided with respective components 102, 202 and metal interconnects $M_1$~$M_m$, $M_1$~$M_n$. Dies 100, 200 are stacked in a direction vertical to the substrate and bonded together through hybrid bonding vias 101, 204 formed on the surfaces of the dies. The hybrid bonding via 101, 204 may be common via or pad that is connected with the metal interconnects $M_1$~$M_m$, $M_1$~$M_n$ inside the dies. Alternatively, in other embodiment, through silicon via (TSV) may be used to achieve the effect of multi-die bonding. Currently available EDA tools in the industry may only extract the parasitic parameters of respective dies in a 3D IC (ex. parasitic capacitance and parasitic resistance between metal interconnect $M_{n-1}$ and metal interconnect $M_n$) and are enable to extract the parasitic parameters at hybrid bonding interfaces between dies (ex. parasitic capacitance and parasitic resistance between metal interconnect $M_m$ and metal interconnect $M_n$). Accordingly, with respect to 3D IC in a design database, standard layout parameter extracting step can't completely reflect the influence of layout on circuit properties.

Figure 3:
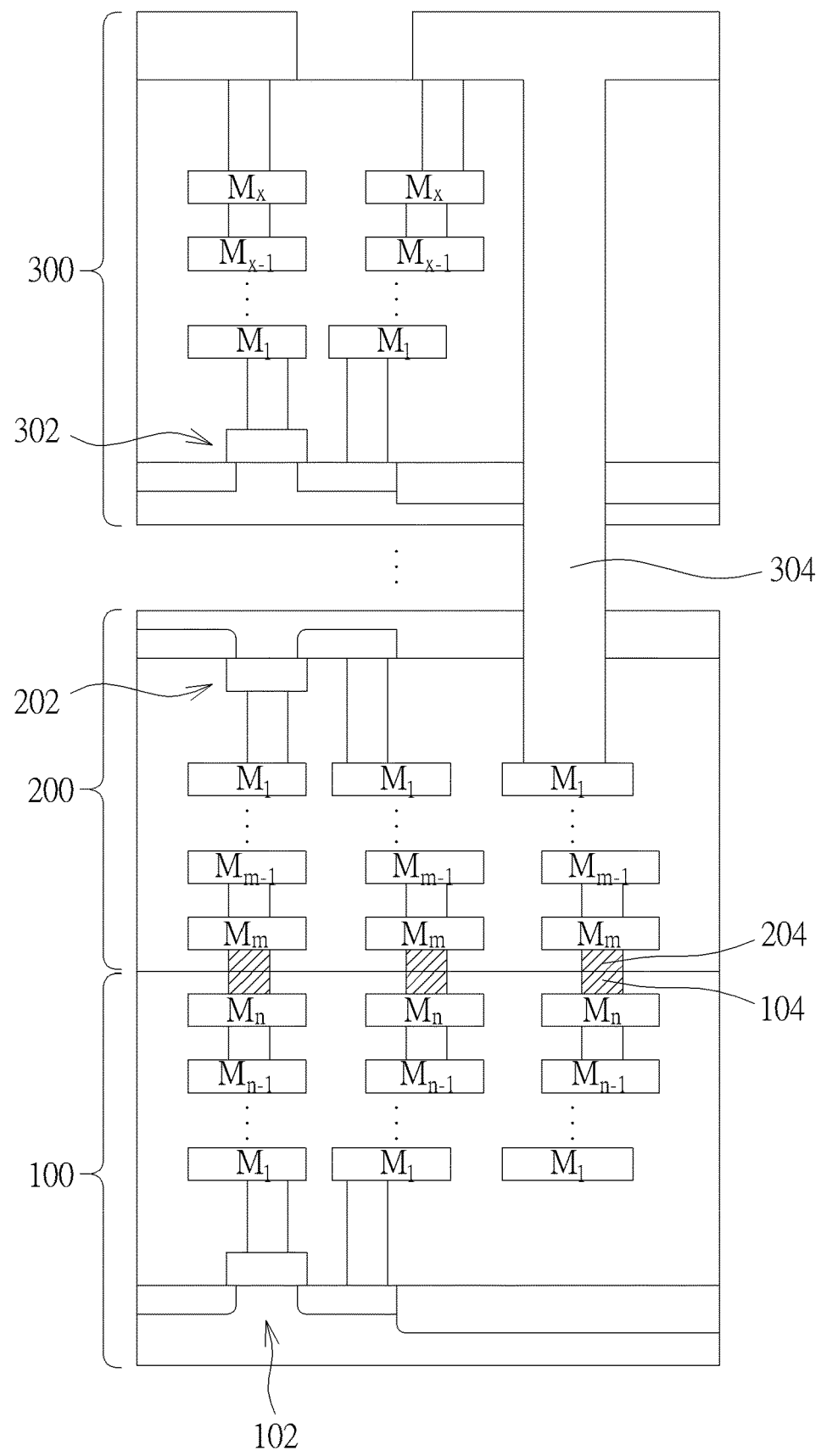
FIG. 3 is a schematic cross-section of a 3D IC in an environment of LPE tool interface in accordance with the preferred embodiment of the present invention.

Please refer now to FIG. 3, which is a schematic cross-section of a 3D IC in a design database in an environment of LPE tool interface in accordance with the preferred embodiment of the present invention. In the light of current deficiency in conventional skill, the present invention hereby proposes a novel method of extracting parasitic parameters, which is suitable for the parasitic parameter extraction in a design database of a 3D IC with multi-die hybrid bonding. As shown in FIG. 3, a 3D IC consists of multiple dies 100, 200, 300, wherein each die 100, 200, 300 is provided with respective components 102, 202, 302 and metal interconnects $M_1$~$M_m$, $M_1$~$M_n$, $M_1$~$M_x$. Dies 100, 200, 300 are stacked in a direction vertical to the substrate and bonded together through the hybrid bonding vias 101, 204 formed on the surfaces of the dies, or may achieve the effect of multi-die bonding through TSVs passing through multiple dies. The hybrid bonding via 101, 204 may be common via or pad that is connected with the metal interconnects $M_1$~$M_m$, $M_1$~$M_n$, $M_1$~$M_x$ inside the dies.

Figure 4:
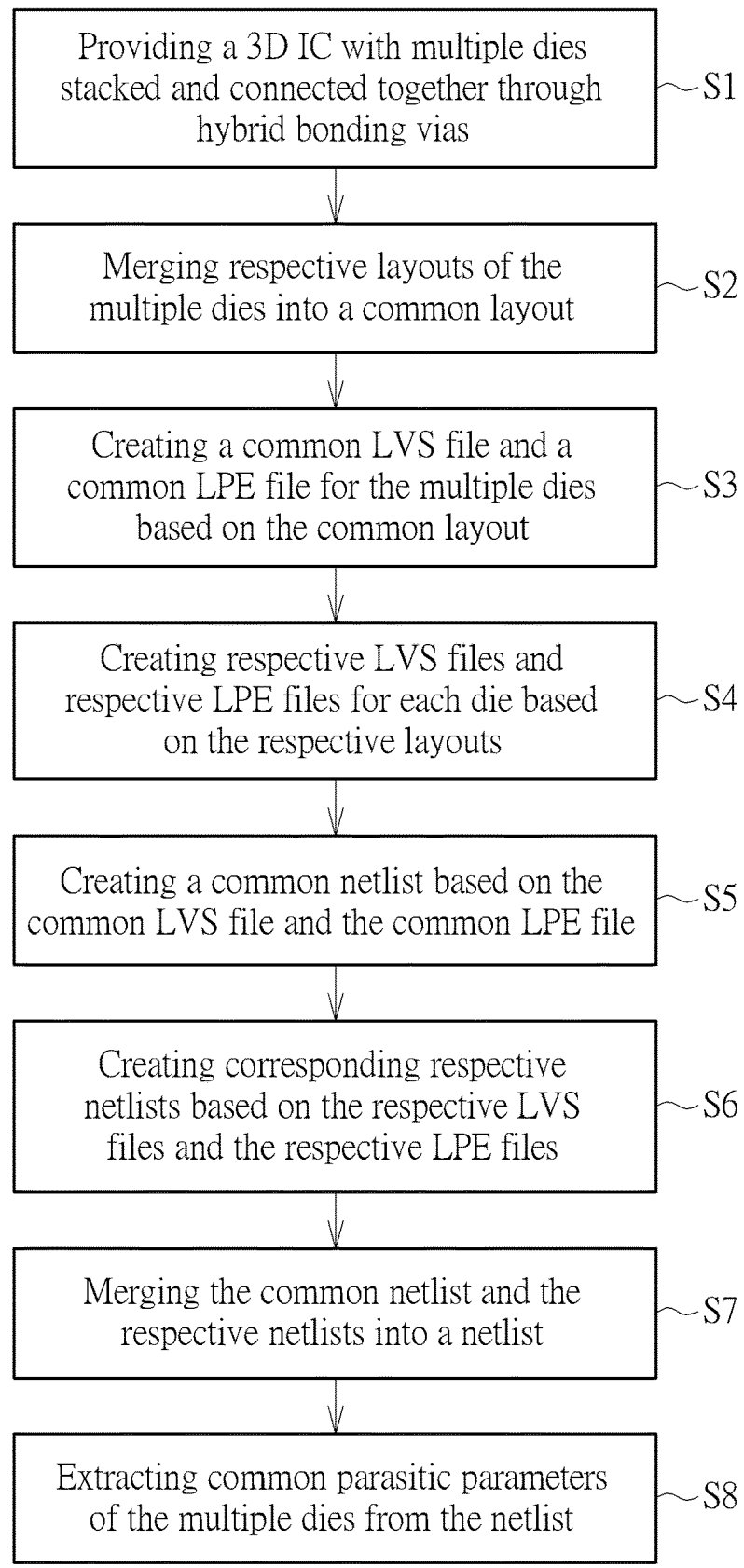
FIG. 4 is a flow chart of the method of extracting parasitic parameters in a 3D IC in accordance with the preferred embodiment of the present invention.

Please refer collectively to FIG. 4, which is a flow chart of the method of extracting parasitic parameters in a design database of a 3D IC in accordance with the preferred embodiment of the present invention. In the method embodiment of present invention, a 3D IC is first provided in step S1, such as the aforementioned 3D IC shown in FIG. 3, with dies 100, 200, 300 stacked and bonded to each other. These dies 100, 200, 300 are all provided with respective layout, which may be stored in a computer readable recording medium in a manner of texts or labels in a GDS (graphic data system) file. GDS is a data exchange format for IC layout, which is primarily used as input data for EDA tools to provide circuit layout in 2D hierarchical form, as the cross-section shown in FIG. 3. In step S2, use EDA tool to merge respective layouts of these dies 100, 200, 300 into a common layout, i.e. complete and integrated layout structure including the dies after bonding as shown in FIG. 3, which may be a GDS file.

After the common layout of the 3D IC is created, in following step S3, use EDA tool to create a common layout versus schematic (LVS) file and a common layout parameter extraction (LPE) file for the dies based on the common layout, wherein the step may include the creating of layout system provided with distinguishable layout labels and data types for every component in the dies in order to avoid the confusion of the same component in different dies during data processing, and may include the creating of the cross-section of the dies after hybrid bonding in the common LPE file, as the complete layout cross-section shown in the LPE interface of FIG. 3. In this way, the created common LVS file and common LPE file would comprise the aforementioned distinguishable layout structures and component information for all the dies in the 3D IC in a design database. The purpose of this step is to enable EDA tool to determine the nodes of parasitic parameters at bonding interfaces between dies.

In addition to the aforementioned common LVS file and common LPE file for all the dies in the 3D IC, in step S4, EDA tool is used to create respective LVS file and respective LPE file for each die based on the respective layouts of the dies, which may include the creating of cross-sections of each die in its corresponding LPE file. In this way, the created respective LVS file and respective LPE file would include the layout structure and component information of the corresponding die in the 3D IC in the design database.

After the common LVS file and common LPE file are created, in following step S5, use EDA tool to create a common netlist based on the common LVS file and common LPE file, wherein connectivity between various components, nodes and/or blocks in the layout and information like the condition or configuration to be simulated and checked are described therein in text and numerical format, in order to provide for circuit simulator to perform the operation like reading, calculating and processing. Basically, multiple descriptive models formed by texts and numbers may be listed in the netlist to define a specific real device. In addition, texts in the descriptive line may also describe the actions and paths to be executed. Generally, netlists may be categorized into pre-layout netlists or post-layout netlists according to their stages in the circuit design flow. The method of extracting parasitic parameters in the present invention may be applied in these two kinds of netlists, especially the post-layout netlist.

Similarly, after the aforementioned respective LVS files and respective LPE files are created, in following step S6, use EDA tool to create respective netlists for each corresponding die based on their respective LVS files and respective LPE files. The difference between these respective netlists and the aforementioned common netliest is that the respective netlist includes only the information of its corresponding die, while the common netlist includes the information of all of the dies (including the nodes at bonding interfaces) in entire 3D IC in the design database.

Since currently available EDA tool can only extract the information of parasitic parameters of single die plus its bonding interfaces from the common netlist in actual extracting operation, thus in following step S7, EDA tool is used to merge the common netlist and the respective netlists into a single netlist. In this way, use EDA tool to perform extracting operation from the merged netlist may extract complete and common parasitic parameters of all the dies including their bonding interfaces, i.e. step S8.

In addition to the aforementioned extracting of common parasitic parameters of the 3D IC, in other embodiment, it is also possible to extract the parasitic parameters at bonding interfaces of the dies and the respective parasitic parameters of one of the dies simultaneously through the common LPE file and the corresponding respective LPE file. Alternatively, it is possible to extract the parasitic parameters at bonding interfaces of the dies and the respective parasitic parameters of the dies respectively through the common LPE file and the respective LPE files, which is not limited thereto.

According to the aforementioned method of present invention, the present invention also proposes a computer readable recording medium with stored program, wherein following steps are performed when a computer executes the program: (1) providing a design database of a 3D IC with multiple dies stacked and connected together through hybrid bonding vias; (2) merging respective layouts of the multiple dies into a common layout; (3) creating a common layout versus schematic (LVS) file and a common layout parameter extraction (LPE) file for the multiple dies based on the common layout; (4) creating respective LVS files and respective LPE files for each die based on the respective layouts; (5) creating a common netlist based on the common LVS file and the common LPE file; (6) creating corresponding respective netlists based on the respective LVS files and the respective LPE files; (7) merging the common netlist and the respective netlists into a netlist; and (8) extracting common parasitic parameters of the multiple dies from the netlist.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A computer-implemented method of extracting parasitic parameters of a 3D IC in a design database, executed by an electronic design automation (EDA) platform installed on a computer architecture, wherein said 3D IC is provided with multiple dies stacked and connected together through hybrid bonding vias, and said method comprises:
   merging respective layouts of said multiple dies in said design database into a common layout;
   creating a common layout versus schematic (LVS) file and a common layout parameter extraction (LPE) file for said multiple dies in said design database based on said common layout;
   creating respective LVS files and respective LPE files for every said die in said design database based on said respective layouts;
   creating a common netlist based on said common LVS file and said common LPE file;
   creating corresponding respective netlists based on said respective LVS files and said respective LPE files;
   merging said common netlist and said respective netlists into a netlist; and
   extracting common parasitic parameters of said multiple dies in said design database from said netlist, wherein parasitic parameters at bonding interfaces of said multiple dies in said design database are extracted through said common LPE file.

2. The computer-implemented method of extracting parasitic parameters of a 3D IC in a design database of claim 1, wherein creating said common LVS file and said common LPE file for said multiple dies in said design database based on said common layout further comprises:
   creating distinguishable layout labels for every component in said multiple dies in said design database; and
   creating a cross-section of said multiple dies after hybrid bonding in said common LPE file.

3. The computer-implemented method of extracting parasitic parameters of a 3D IC in a design database of claim 1, wherein creating said respective LVS files and said respective LPE files for every said die in said design database based on said respective layouts comprises creating a cross-section of each said die in said design database in corresponding said respective LPE file.

4. The computer-implemented method of extracting parasitic parameters of a 3D IC in a design database of claim 1, wherein respective parasitic parameters of every said dies in said design database are extracted through said respective LPE files.

5. The computer-implemented method of extracting parasitic parameters of a 3D IC in a design database of claim 1, parasitic parameters at bonding interfaces of said multiple dies in said design database and respective parasitic parameters of one of said multiple dies in said design database are extracted simultaneously through said common LPE file and corresponding said respective LPE file.

6. The computer-implemented method of extracting parasitic parameters of a 3D IC in a design database of claim 1, parasitic parameters at bonding interfaces of said multiple dies in said design database and respective parasitic parameters of every said dies in said design database are extracted respectively through said common LPE file and said respective LPE files.

7. A computer readable recording medium with stored program, performing following steps when a computer executes said program:
   providing a design database of a 3D IC with multiple dies stacked and connected together through hybrid bonding vias;
   merging respective layouts of said multiple dies in said design database into a common layout;
   creating a common layout versus schematic (LVS) file and a common layout parameter extraction (LPE) file for said multiple dies in said design database based on said common layout;
   creating respective LVS files and respective LPE files for every said die in said design database based on said respective layouts;
   creating a common netlist based on said common LVS file and said common LPE file;
   creating corresponding respective netlists based on said respective LVS files and said respective LPE files;
   merging said common netlist and said respective netlists into a netlist; and
   extracting common parasitic parameters of said multiple dies in said design database from said netlist, wherein parasitic parameters at bonding interfaces of said multiple dies in said design database are extracted through said common LPE file.

8. The computer readable recording medium with stored program of claim 7, wherein creating said common LVS file and said common LPE file for said multiple dies in said design database based on said common layout further comprises:
   creating distinguishable layout labels for every component in said multiple dies in said design database; and
   creating a cross-section of said multiple dies in said design database after hybrid bonding in said common LPE file.

9. The computer readable recording medium with stored program of claim 7, wherein creating said respective LVS files and said respective LPE files for every said die in said design database based on said respective layouts comprises creating a cross-section of each said die in said design database in corresponding said respective LPE file.

10. The computer readable recording medium with stored program of claim 7, wherein respective parasitic parameters of every said dies in said design database are extracted through said respective LPE files.

11. The computer readable recording medium with stored program of claim 7, parasitic parameters at bonding interfaces of said multiple dies in said design database and respective parasitic parameters of one of said multiple dies in said design database are extracted simultaneously through said common LPE file and corresponding said respective LPE file.

12. The computer readable recording medium with stored program of claim 7, parasitic parameters at bonding interfaces of said multiple dies in said design database and respective parasitic parameters of every said dies in said design database are extracted respectively through said common LPE file and said respective LPE files.

\* \* \* \* \*